(12) United States Patent
Ha et al.

(10) Patent No.: US 8,476,162 B2
(45) Date of Patent: Jul. 2, 2013

(54) METHODS OF FORMING LAYERS ON SUBSTRATES

(75) Inventors: Tae Hong Ha, San Jose, CA (US); Winsor Lam, San Francisco, CA (US); Tza-Jing Gung, San Jose, CA (US); Joung Joo Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 13/269,243

(22) Filed: Oct. 7, 2011

(65) Prior Publication Data

US 2012/0108058 A1    May 3, 2012

Related U.S. Application Data

(60) Provisional application No. 61/407,227, filed on Oct. 27, 2010.

(51) Int. Cl.
*H01L 21/44* (2006.01)

(52) U.S. Cl.
USPC ............... 438/654; 438/695; 257/E21.584

(58) Field of Classification Search
USPC .......... 438/654, 695; 257/751, 753, E21.584
See application file for complete search history.

(56) References Cited

U.S. PATENT DOCUMENTS

| | | | | |
|---|---|---|---|---|
| 6,436,267 B1 * | 8/2002 | Carl et al. | ...... | 205/186 |
| 6,458,251 B1 * | 10/2002 | Sundarrajan et al. | .... | 204/192.12 |
| 7,547,644 B2 * | 6/2009 | Chen et al. | ...... | 438/758 |
| 7,807,568 B2 * | 10/2010 | Fu et al. | ...... | 438/643 |
| 7,829,456 B2 | 11/2010 | Lam et al. | | |
| 2008/0110747 A1 * | 5/2008 | Ding et al. | ...... | 204/192.17 |
| 2012/0070982 A1 * | 3/2012 | Yu et al. | ...... | 438/653 |

\* cited by examiner

*Primary Examiner* — Trung Q Dang
(74) *Attorney, Agent, or Firm* — Moser Taboada; Alan Taboada

(57) ABSTRACT

Methods for forming layers on a substrate are provided herein. In some embodiments, methods of forming layers on a substrate disposed in a process chamber may include depositing a barrier layer comprising titanium within one or more features in the substrate; and sputtering a material from a target in the presence of a plasma formed from a process gas by applying a DC power to the target, maintaining a pressure of less than about 500 mTorr within the process chamber, and providing up to about 5000 W of a substrate bias RF power to deposit a seed layer comprising the material atop the barrier layer.

20 Claims, 4 Drawing Sheets

METHODS OF FORMING LAYERS ON SUBSTRATES

CROSS-REFERENCE TO RELATED APPLICATIONS

This application claims benefit of U.S. provisional patent application Ser. No. 61/407,227, filed Oct. 27, 2010, which is herein incorporated by reference.

FIELD

Embodiments of the present invention generally relate to substrate processing.

BACKGROUND

Conventional processes commonly used for fabricating integrated circuits having features formed in a substrate include depositing a first material layer (a "buffer layer") into bottoms of the features and re-sputtering the material using high energy ions to facilitate redistribution from the bottoms to the sidewalls of the features. However, if the ion energy of the ions is too high, the ions may cause physical damage to the underlying layers and to the substrate itself, particularly at the corners, or bevel, and bottom of the features. Conversely, if the ion energy is too low, material may build up near the openings of the features, causing overhang build up and possibly cause the feature opening to become completely closed and form a void.

To attempt to overcome the above problems, a titanium (Ti) barrier layer may be utilized to protect the underlying substrate. However, the inventors have observed that using titanium as a barrier layer may cause the resistivity of the integrated circuit to undesirably increase. The inventors believe that this is due to the thermodynamic inter-mixing properties of the titanium layer and material layer. Alternatively, a hard mask, such as titanium nitride (TiN), may be used as a barrier layer. However, the inventors have observed that using a hard mask may induce stress within the integrated circuit, which may lead to device degradation.

Therefore, the inventors have provided improved methods for processing substrates.

SUMMARY

Methods for forming layers on a substrate are provided herein. In some embodiments, methods of forming layers on a substrate disposed in a process chamber may include depositing a barrier layer comprising titanium within one or more features in the substrate; and sputtering a material from a target in the presence of a plasma formed from a process gas by applying a DC power to the target, maintaining a pressure of less than about 500 mTorr within the process chamber, and providing up to about 5000 W of a substrate bias RF power to deposit a seed layer comprising the material atop the barrier layer.

In some embodiments, a computer readable medium is provided having instructions stored thereon which, when executed by a controller, causes a process chamber having a substrate disposed therein to have layers formed thereon by a method. In some embodiments, the method may include depositing a barrier layer comprising titanium within one or more features in the substrate; and sputtering a material from a target in the presence of a plasma formed from a process gas by applying a DC power to the target, maintaining a pressure of less than about 500 mTorr within the process chamber, and providing up to about 5000 W of a substrate bias RF power to deposit a seed layer comprising the material atop the barrier layer.

In some embodiments, methods of forming layers on a substrate disposed in a process chamber may include depositing a barrier layer comprising titanium within one or more features in the substrate, wherein the features have an aspect ratio of at least about 4:1; sputtering a material comprising copper (Cu) from a target in the presence of a plasma formed from a process gas by applying a about 500 W to about 80 kW of DC power to the target and maintaining a pressure of less than about 500 mTorr within the process chamber; rotating a magnetron disposed proximate the target to form a magnetic field proximate the target to increase a density of the plasma proximate a surface of the target; providing up to about 5000 W of a substrate bias RF power having a frequency of about 1 to about 60 MHz to deposit a seed layer comprising the material atop the barrier layer; and depositing a conductive material atop the seed layer to fill the feature.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
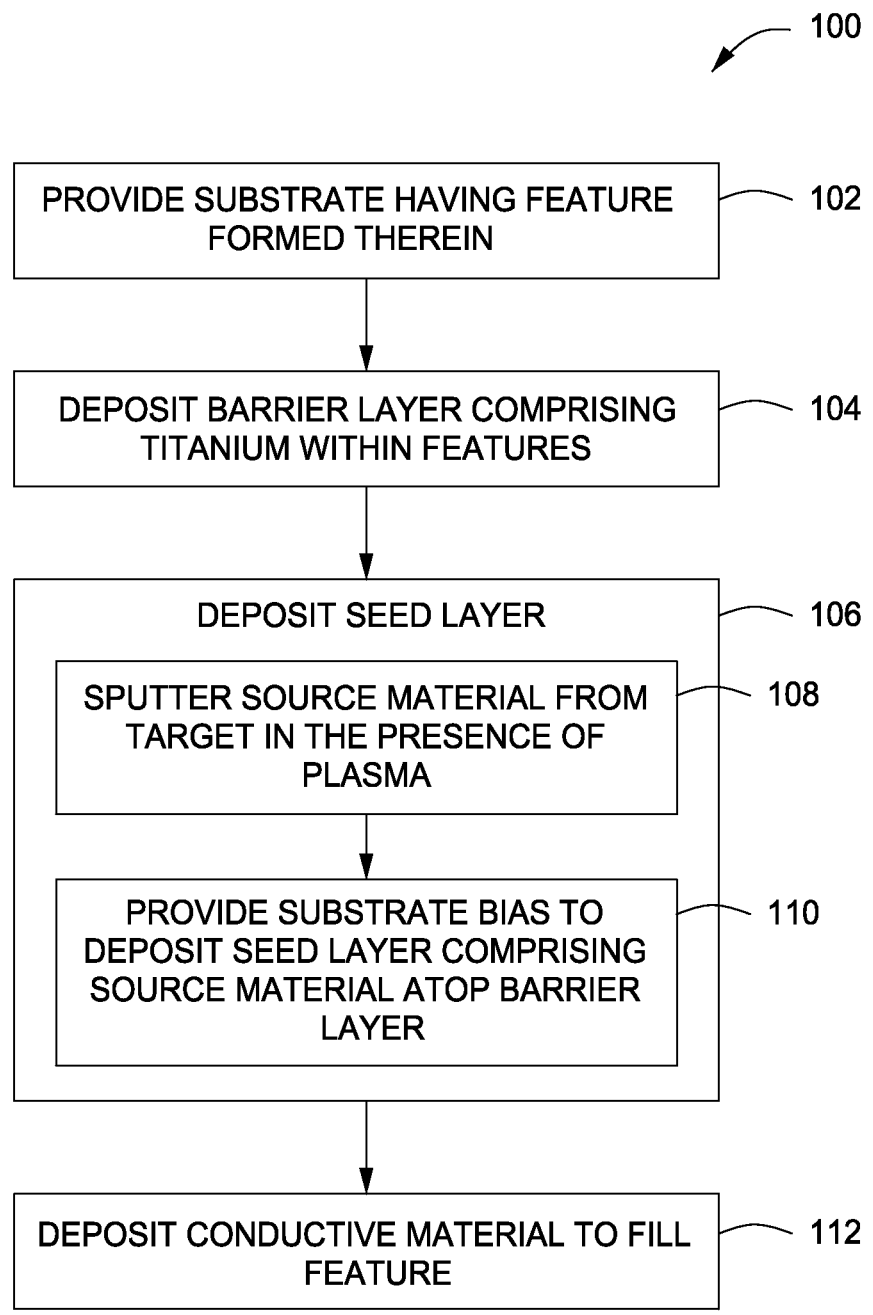
FIG. 1 depicts a method for forming layers on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to methods for forming layers on a substrate having one or more features formed therein. Embodiments of the present invention may advantageously eliminate the need to deposit additional layers into the features of the substrate (e.g., barrier layers or buffer layers) to protect underlying substrate layers, therefore allowing more room within the features to deposit additional materials. In some embodiments, the inventive methods may further advantageously provide for better step coverage and less overhang of material on feature openings, therefore providing an increased feature opening after layer deposition. In addition, in some embodiments, the inventive methods may further advantageously provide a barrier layer having increased wetting properties and reduced stress levels on the substrate after deposition, thereby providing an increased resistance to stress migration and electro-migration between layers and decreased resistivity.

FIG. 1 depicts a method 100 for processing of substrates in accordance with some embodiments of the present invention. FIGS. 2A-2E are illustrative cross-sectional views of a substrate during different stages of the processing sequence depicted in FIG. 1, in accordance with some embodiments of the present invention. The above method may be performed in any apparatus suitable for processing semiconductor substrates in accordance with embodiments of the present invention, for example, such as discussed below with respect to FIG. 3.

The method 100 generally begins at 102, where a substrate 200 having one or more features 210 disposed therein is provided, as depicted in FIG. 2. The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the substrate 200 may comprise one or more layers, for example, such as a bulk dielectric layer 212 disposed over a dielectric layer 214. The bulk dielectric layer 212 and the dielectric layer 214 may comprise any dielectric materials suitable for substrate fabrication. For example in some embodiments, the bulk dielectric layer 212 and/or the dielectric layer 214 may comprise silicon oxide ($SiO_2$), silicon nitride (SiN), a low-K material, or the like. In embodiments where the bulk dielectric layer 212 and/or the dielectric layer 214 comprise a low-k material, the low-k material may comprise carbon-doped dielectric materials (such as carbon-doped silicon oxide (SiOC), BLACK DIAMOND® dielectric material available from Applied Materials, Inc. of Santa Clara, Calif., or the like), an organic polymer (such as polyimide, parylene, or the like), organic doped silicon glass (OSG), fluorine doped silicon glass (FSG), or the like. As used herein, low-k materials are materials having a dielectric constant less than about that of silicon oxide ($SiO_2$), which is about 3.9. In some embodiments, the bulk dielectric layer 212 and the dielectric layer 214 may comprise the same, or in some embodiments, different dielectric materials.

In some embodiments, a conductive feature 216 may be disposed in an upper region of the dielectric layer 214 such that an upper surface of the conductive feature 216 may be exposed by the feature 210 formed in the dielectric layer 212. For example, a via/trench etching process may be performed to form the feature 210 in the dielectric layer 212, thereby exposing an upper surface of the conductive feature 216. The conductive feature 216 may be fabricated from any suitable conductive material. For example, in some embodiments, the conductive feature 216 may be fabricated from a metal, such as copper, aluminum, tungsten, nickel, cobalt, or the like, alloys thereof, or combinations thereof.

The feature 210 generally comprises one or more sidewalls 201 and a bottom 203 and may be a via, a trench, a dual damascene feature, or the like. The feature 210 may be formed through any suitable process, for example, such as an etch process. Although shown as a single feature, multiple features may be simultaneously processed in accordance with the teachings disclosed herein. Although the feature 210 may generally have any dimensions, in some embodiments, the feature 210 is a high aspect ratio feature. For example, in some embodiments, the feature may height to width aspect ratio of at least about 4:1. For example, in some embodiments, the aspect ratio may range from about 1:1 to about 10:1. In some embodiments, the feature 210 may be disposed completely through the substrate 200, or may be part of a high aspect ratio feature having a bottom to be exposed by removing material from a back surface of the substrate, such as in a through silicon via (TSV) application.

Next, at 104, a barrier layer 218 (e.g., a first layer) comprising titanium (Ti) may be deposited within the features 210 of the substrate 200, as depicted in 2B. The barrier layer 218 may serve as an electrical and/or physical barrier to prevent or limit diffusion of materials or electro-migration from the feature into underlying and/or adjacent layers (e.g., dielectric layer 214 and/or bulk dielectric layer 212, or the like). Alternatively or in combination, in some embodiments, the barrier layer 218 may function as a better surface for attachment during the deposition process than a native surface of the substrate 200.

The barrier layer 218 may be deposited in any suitable manner. For example, in some embodiments, the barrier layer 218 may be deposited via a physical vapor deposition (PVD) process in a suitable process chamber such as the process chamber 300 described below with respect to FIG. 3. In such embodiments, the process chamber may have a target (e.g., target 342) comprising a titanium material to be deposited within the feature 210 of the substrate 200. The barrier layer 218 may be deposited to a thickness that provides sufficient coverage of the bottom 203 and sidewalls 201 of the feature 210. For example, in some embodiments, the barrier layer 218 may be deposited to a thickness of about 5 to about 1000 Å, depending upon the feature size. As used herein, the thickness refers to both the field thickness and the thickness on the bottom of the feature.

In some embodiments, depositing the barrier layer 218 may generally include forming a plasma from a process gas provided to the process chamber. Charged ions from the plasma are directed towards the target, causing the target to eject atoms of the titanium material which may then deposit on the substrate 200. The process gas may be any process gas suitable to facilitate ejection of the atoms of the titanium material from the target. For example, in some embodiments the process gas may comprise an inert gas, such as argon (Ar), helium (He), or the like. In some embodiments, the process gas may include one or more additional gases such as one or more of hydrogen ($H_2$), nitrogen ($N_2$), oxygen ($O_2$), or the like. In some embodiments, the process gas may be provided at a flow rate of up to about 500 sccm.

In some embodiments, a source power may be applied to the target to ignite the process gas to form the plasma. In some embodiments, the source power may comprise a DC power of about 500 W to about 80 kW. In some embodiments, the DC power may be varied throughout the process to facilitate selective deposition of the barrier layer 218. Alternatively, in some embodiments, an RF signal may be supplied at a power up to about 20 kW at a frequency of between about 1 MHz to about 60 MHz.

In some embodiments, to facilitate deposition of the ejected atoms of the titanium material on the substrate 200, a bias power in the form of RF power may be applied to an electrode buried within a substrate support (e.g., substrate support 352 described below) disposed within the process chamber. In some embodiments, up to about 1.5 kW of bias RF power may be supplied at a frequency of about 1 to about 20 MHz, or in some embodiments, about 13.56 MHz. In some embodiments, more than one bias RF power source, for example, two bias RF power sources may be utilized, providing a dual frequency substrate bias. In such embodiments, up to about 1.5 kW of bias RF power of a first RF bias signal may be provided at a frequency of between about 1 to about 60 MHz, and up to about 1.5 kW of bias RF power of a second RF bias signal may be provided at a frequency of between about 1 to about 60 MHz.

In addition to the above, additional process parameters may be utilized to facilitate deposition of the barrier layer 218. For example, in some embodiments, the process chamber may be maintained at a pressure of about 0 to about 500 mTorr. In addition, in some embodiments, the process chamber may be maintained at a temperature of less than about 800 degrees Celsius, or in some embodiments, about −40 degrees Celsius to about 600 degrees Celsius.

Next, at 106 a seed layer 224 is deposited atop the barrier layer 218, as depicted in 2C. The seed layer 224 may comprise any material suitable to act as a seed layer to facilitate deposition of subsequent layers thereon. For example, in some embodiments, the seed layer 224 may comprise a metal, for example, copper (Cu), aluminum (Al), tungsten (W), nickel (Ni), and cobalt (Co), or the like.

The seed layer 224 may be deposited via a PVD process in a suitable process chamber having a target comprising a material to be deposited atop the barrier layer 218, for example such as the process chamber 300 described below with respect to FIG. 3. In some embodiments, the process chamber may be a different process chamber or, in some embodiments, the same process chamber utilized to deposit the barrier layer 218.

To deposit the seed layer 224, first, at 108, the material may be sputtered from the target in the presence of a plasma. In such embodiments, the charged ions of the plasma react with material from the target, causing the target to eject atoms of the material, thereby sputtering the material from the target. The target may comprise any material suitable to deposit a desired seed layer. For example, in some embodiments, the material may comprise a metal, for example, copper (Cu).

To form the plasma, a process gas may be provided to the process chamber. The process gas may be any process gas suitable to facilitate ejection of the atoms of the material from the target as described above. For example, in some embodiments the process gas may comprise an inert gas, such as argon (Ar), helium (He), or the like. In some embodiments, the process gas may be provided at a flow rate of up to about 500 sccm. A source power may be applied to the target to couple the power to the process gas, thereby igniting the process gas to form the plasma. In some embodiments, the source power may comprise a DC power of about 500 W to about 80 kW. In some embodiments, the DC power may be varied throughout the process to facilitate selective deposition of the barrier layer 218.

In some embodiments, a magnetron (e.g., magnetron 370 described below) may be utilized to increase a sputtering rate of the material from the target. When present, the magnetron produces a magnetic field within the process chamber generally parallel and close to the surface of the target to trap electrons which can collide with and ionize of any gas molecules proximate the target, which in turn increases the local ion species density proximate the surface of the target and increases the sputtering rate.

Next at 110, a substrate bias may be provided to direct the material sputtered from the target towards the substrate, thereby facilitating depositing the seed layer 224 atop the barrier layer 218. In some embodiments, the substrate bias may be provided by applying a bias power in the form of RF power to an electrode buried within a substrate support (e.g., substrate support 352 described below) disposed within the process chamber. In some embodiments, a high bias power, for example, up to about 5000 W of RF power may be supplied at a frequency of about 1 to about 60 MHz, or in some embodiments, about 13.56 MHz. Providing a high bias power during the seed layer 224 facilitates a net etch on the seed layer 224 during deposition, thereby allowing the seed layer 224 material to be redistributed within the feature 210, thus providing adequate coverage of the seed layer 224 on the bottom 203 and sidewalls 201 of the feature 210. In some embodiments, more than one RF power source, for example, two RF power sources may be utilized, providing a dual frequency substrate bias. In such embodiments, up to about 5000 W of RF power of a first RF bias signal may be provided at a frequency of between about 1 to about 60 MHz and up to about 5000 W of RF power of a second RF bias signal may be provided at a frequency of between about 1 to about 60 MHz.

In some embodiments, to further facilitate deposition of the seed layer 224 on the substrate 200 the process chamber may be maintained at a low pressure. For example, in some embodiments, the process chamber may be maintained at a pressure of about 0 mTorr to about 500 mTorr. Maintaining the process chamber at a low pressure ensures the environment within the process chamber is mostly occupied by material ions, as opposed to charged ions of the process gas. By limiting the amount of charged ions of the process gas the incidence of charged inert gas ions bombarding the substrate is reduced, thus reducing damage to the substrate 200 surfaces and/or barrier layer 218.

In addition to the above, additional process parameters may be utilized to facilitate deposition of the barrier layer 218. For example, in some embodiments, the process chamber may be maintained at a temperature of about −40 degrees Celsius to about 600 degrees Celsius.

The inventors have observed that, in some embodiments where the barrier layer 218 comprises titanium (Ti) or mixture of titanium nitride & titanium and the seed layer 224 comprises copper (Cu), due to the thermodynamic intermixing properties of both titanium (Ti) and copper (Cu), an intermediate intermixing occurs during the seed layer 224 deposition process. As a result, a titanium (Ti)-copper (Cu) interface forms between the barrier layer 218 and seed layer 224. The titanium (Ti)-copper (Cu) interface advantageously prevents further mixing of titanium (Ti) and copper (Cu), thereby reducing or eliminating a resistivity increase that may occur during conventional deposition processes.

Figure 2A:
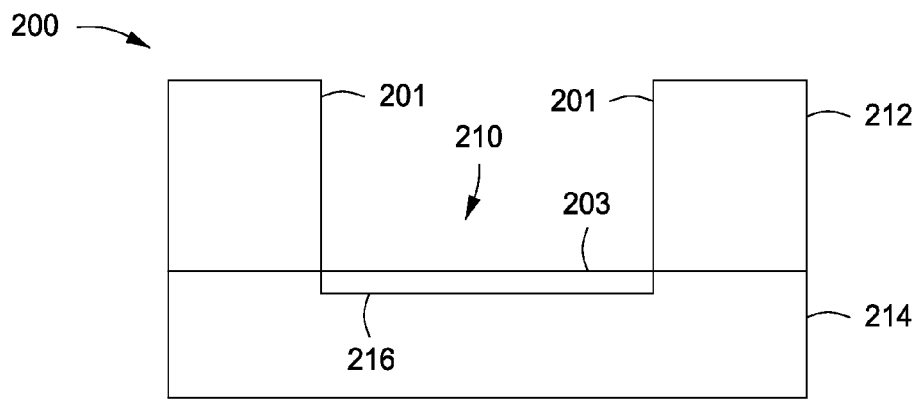
FIGS. 2A-E are illustrative cross-sectional views of a substrate during different stages of the method for forming layers on a substrate in accordance with some embodiments of the present invention.
Figure 2B:
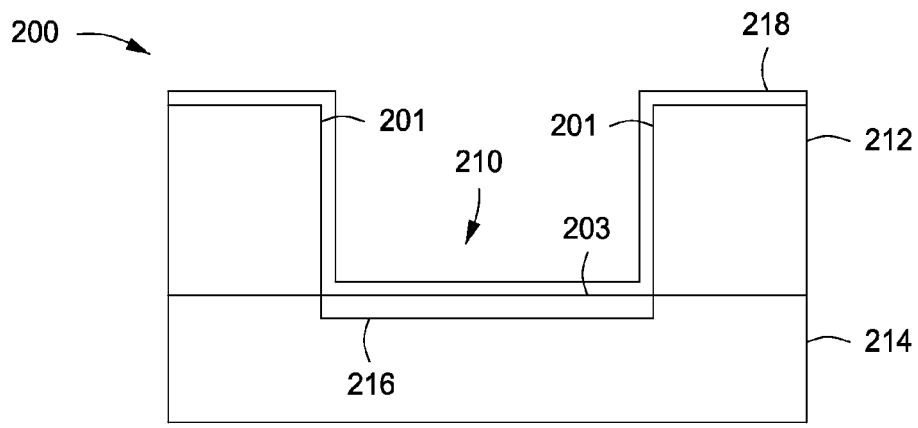
Figure 2C:
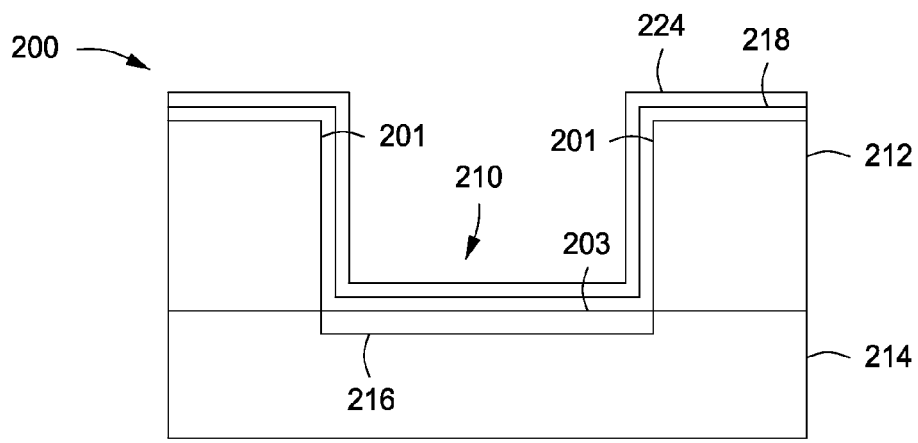
Figure 2D:
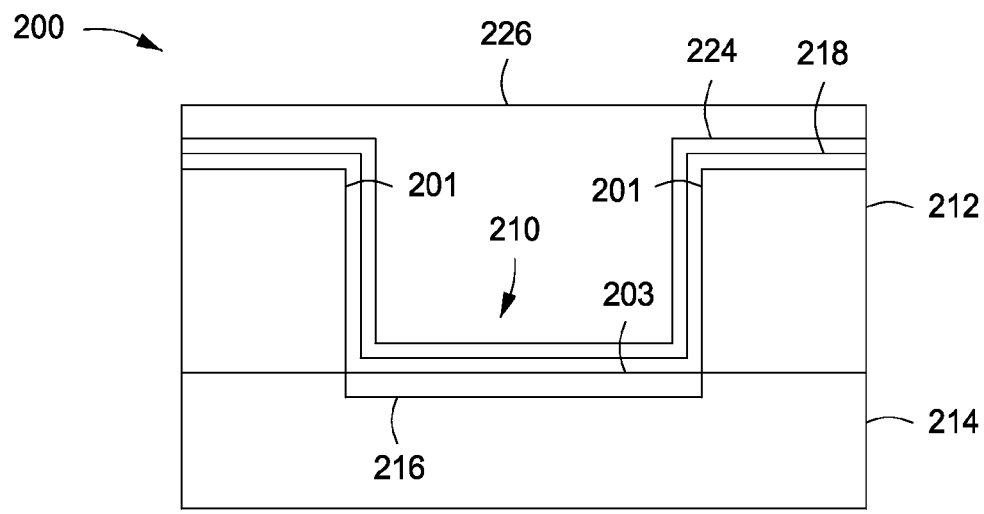
Figure 2E:
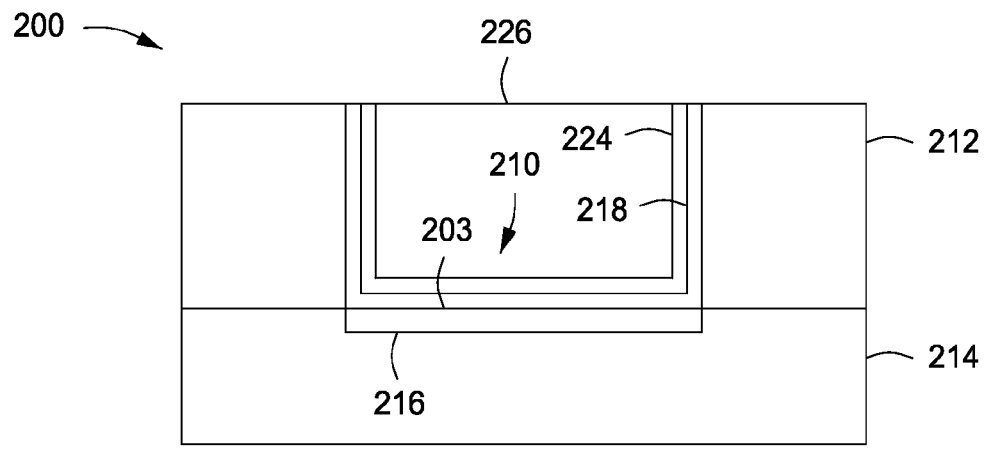

Next, at 112, a conductive material 226 may be deposited atop the barrier layer 224 to fill the features 210, as depicted in FIG. 2D. The conductive material 224 may be deposited in any manner such as electrochemical deposition, or plating (ECP), or the like. In some embodiments, the conductive material 224 may be aluminum, copper, tungsten, nickel, cobalt, or the like. After filling the feature 210 with the conductive material 224, chemical mechanical polishing (CMP) or other suitable technique may be used to remove the excess conductive material 224 outside the feature 210 (and any other features, such as other vias, trenches, dual damascene structures, or the like), as depicted in FIG. 2E.

After depositing the conductive material 226 to fill the features, the method generally ends and the substrate 200 may proceed for further processing, such as deposition, etch, annealing, or the like. For example, in some embodiments additional layers may be deposited, for example additional dielectric layers and/or metallization structures may be formed over the filled features 210.

The inventive methods described herein may be performed in a PVD chamber as described below. FIG. 3 illustrates one embodiment of a PVD chamber (process chamber 300) in which the invention may be practiced. Examples of suitable PVD chambers include the ENDURA® EXTENSA TTN and ENDURA® ENCORE processing chambers, both commercially available from Applied Materials, Inc., of Santa Clara, Calif. It is contemplated that other processing chambers from other manufactures may also be utilized to perform the present invention.

In some embodiments, the process chamber 300 contains a substrate support pedestal 352 for receiving the substrate 200 thereon, and a sputtering source, such as a target 342. The substrate support pedestal 352 may be located within a grounded enclosure wall 350, which may be a chamber wall (as shown) or a grounded shield (not shown).

The target 342 may be supported on a grounded conductive aluminum adapter 344 through a dielectric isolator 346. The target 342 comprises a material to be deposited on the substrate 200 during sputtering, for example, such as the materials deposited atop the substrate 200 as described above.

The substrate support pedestal 352 has a material-receiving surface facing the principal surface of the target 342 and supports the substrate 200 to be processed in planar position opposite to the principal surface of the target 342. The substrate support pedestal 352 may support the substrate 200 in a central region 340 of the processing chamber 300. The central region 340 is defined as the region above the substrate support pedestal 352 during processing (for example, between the target 342 and the substrate support pedestal 352 when in a processing position).

Figure 3:
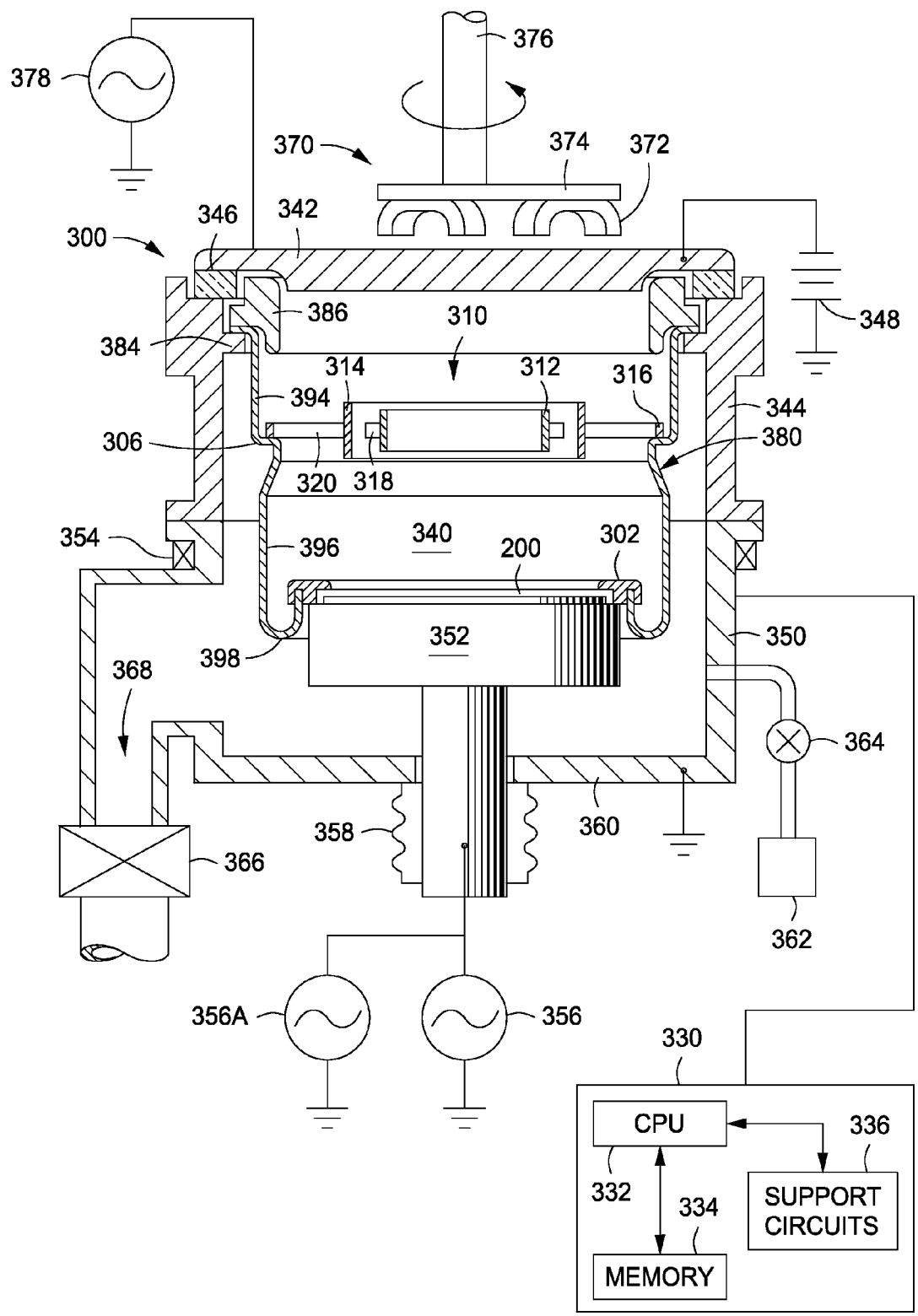
FIG. 3 depicts an apparatus suitable for forming layers on a substrate in accordance with some embodiments of the present invention.

The substrate support pedestal 352 is vertically movable through a bellows 358 connected to a bottom chamber wall 360 to allow the substrate 200 to be transferred onto the substrate support pedestal 352 through a load lock valve (not shown) in the lower portion of processing the chamber 300 and thereafter raised to a deposition, or processing position as depicted in FIG. 3. One or more processing gases may be supplied from a gas source 362 through a mass flow controller 364 into the lower part of the process chamber 300. An exhaust port 368 may be provided and coupled to a pump (not shown) via a valve 366 for exhausting the interior of the processing chamber 300 and facilitating maintaining a desired pressure inside the process chamber 300.

A controllable DC power source 348 may be coupled to the chamber 300 to apply a negative voltage, or bias, to the target 342. In some embodiments, an RF power supply 378 may be coupled to the chamber 300 to induce a bias on the target 342. An RF power supply 356 may be coupled to the substrate support pedestal 352 in order to induce a negative DC bias on the substrate 200. In some embodiments, an additional RF power supply 356A may also be coupled to the substrate support pedestal to facilitate providing a dual frequency substrate bias. In addition, in some embodiments, a negative DC self-bias may form on the substrate 200 during processing. In other applications, the substrate support pedestal 352 may be grounded or left electrically floating.

A rotatable magnetron 370 may be positioned proximate a back surface of the target 342. The magnetron 370 includes a plurality of magnets 372 supported by a base plate 374. The base plate 374 connects to a rotation shaft 376 coincident with the central axis of the chamber 300 and the substrate 200. The magnets 372 produce a magnetic field within the chamber 300, generally parallel and close to the surface of the target 342 to trap electrons and increase the local plasma density, which in turn increases the sputtering rate. The magnets 372 produce an electromagnetic field around the top of the chamber 300, and magnets 372 are rotated to rotate the electromagnetic field which influences the plasma density of the process to more uniformly sputter the target 342. In some embodiments, the magnets can also be arranged to produce a magnetic field which extends to the substrate, which influences the plasma density of the process in a region proximate the substrate to more uniformly resputter the materials on the substrate.

The chamber 300 further includes a grounded bottom shield 380 connected to a ledge 384 of the adapter 344. A dark space shield 386 is supported on the bottom shield 380 and is fastened to the shield 380 by screws or other suitable manner. The metallic threaded connection between the bottom shield 380 and the dark space shield 386 allows the two shields 380, 386 to be grounded to the adapter 344. The adapter 344 in turn is sealed and grounded to the aluminum chamber sidewall 350. Both shields 380, 386 are typically formed from hard, non-magnetic stainless steel. In some embodiments, the shields 380, 386 may contain heating elements for active temperature control. In some embodiments, the shields can be formed from non conducting materials such as ceramic.

The bottom shield 380 extends downwardly in an upper tubular portion 394 of a first diameter and a lower tubular portion 396 of a second diameter. The bottom shield 380 extends along the walls of the adapter 344 and the chamber wall 350 downwardly to below a top surface of the substrate support pedestal 352 and returns upwardly until reaching a top surface of the substrate support pedestal 352 (e.g., forming a u-shaped portion 398 at the bottom). A cover ring 302 rests on the top of the upwardly extending inner portion of the bottom shield 380 when the substrate support pedestal 352 is in its lower, loading position but rests on the outer periphery of the substrate support pedestal 352 when it is in its upper, deposition position to protect the substrate support pedestal 352 from sputter deposition. An additional deposition ring (not shown) may be used to shield the periphery of the substrate 200 from deposition.

The process chamber 300 may also be adapted to provide a more directional sputtering of material onto a substrate 200. In one embodiment, directional sputtering may be achieved by positioning a collimator 310 between the target 342 and the substrate support pedestal 352 to provide a more uniform and symmetrical flux of deposition material to the substrate 200.

The collimator 310 may rest on the ledge portion of the bottom shield 380, thereby grounding the collimator 310. The collimator 310 may be a metal ring and may include an outer tubular section and at least one inner concentric tubular section, for example, three concentric tubular sections 312, 314, 316 linked by cross struts 320, 318. The outer tubular section 316 rests on the ledge portion 306 of the bottom shield 380. The use of the bottom shield 380 to support the collimator 410 simplifies the design and maintenance of the chamber 300. At least the two inner tubular sections 312, 314 are of sufficient height to define high aspect ratio apertures that partially collimate the sputtered particles. Further, the upper surface of the collimator 310 acts as a ground plane in opposition to the biased target 342, which facilitates keeping plasma electrons away from the substrate 200.

In some embodiments, a magnet 354 may be disposed about the chamber 300 for selectively providing a magnetic field between the substrate support pedestal 352 and the target 342. For example, as shown in FIG. 3, the magnet 354 may be disposed about the outside of the chamber wall 350 in a region just above the substrate support pedestal 352 when in processing position. The magnet 354 may be an electromagnet and may be coupled to a power source (not shown) for controlling the magnitude of the magnetic field generated by the electromagnet.

A controller 330 is coupled to various components of the process chamber 300 and comprises a central processing unit (CPU) 332, a memory 334, and support circuits 336 for the CPU 332. The controller 330 may control the substrate processing apparatus 100 directly, or via computers (or controllers) associated with particular process chamber and/or the support system components. The controller 330 may be one of any form of general-purpose computer processor that can be used in an industrial setting for controlling various chambers and sub-processors. The memory, or computer-readable medium, 334 of the CPU 332 may be one or more of readily available memory such as random access memory (RAM), read only memory (ROM), floppy disk, hard disk, flash, or any other form of digital storage, local or remote. The support circuits 336 are coupled to the CPU 332 for supporting the processor in a conventional manner. These circuits include cache, power supplies, clock circuits, input/output circuitry and subsystems, and the like. Inventive methods as described herein may be stored in the memory 334 as software routine that may be executed or invoked to control the operation of the process chamber 300 in the manner described herein. The software routine may also be stored and/or executed by a second CPU (not shown) that is remotely located from the hardware being controlled by the CPU 332.

Thus, methods forming layers on a substrate having one or more features formed therein have been provided herein. The inventive methods may advantageously eliminate the need to deposit additional layers into the features of the substrate (e.g., barrier layers or buffer layers) to protect underlying substrate layers, therefore allowing more room within the features to deposit additional materials. The inventive methods may further advantageously provide for better step coverage and less overhang of material on feature openings, therefore providing an increased feature opening after layer deposition. In addition, the inventive methods may further advantageously provide a barrier layer having increased wetting properties and reduced stress levels on the substrate after deposition, thereby providing an increased resistance to stress migration and electro-migration between layers and decreased resistivity.

While the foregoing is directed to embodiments of the present invention, other and further embodiments of the invention may be devised without departing from the basic scope thereof.

The invention claimed is:

1. A method of forming layers on a substrate disposed in a process chamber, comprising:
   depositing a barrier layer comprising titanium within one or more features in the substrate; and
   sputtering a material from a target in the presence of a plasma formed from a process gas by applying a DC power to the target, maintaining a pressure of less than about 500 mTorr within the process chamber, and providing up to about 5000 W of a substrate bias RF power to deposit a seed layer comprising the material atop the barrier layer.

2. The method of claim 1, wherein the substrate bias RF power is provided having a frequency of about 1 MHz to about 60 MHz.

3. The method of claim 1, wherein the seed layer comprises one of copper (Cu), aluminum (Al), tungsten (W), nickel (Ni) and cobalt (Co).

4. The method of claim 1, further comprising:
   depositing a conductive material atop the seed layer to fill the feature.

5. The method of claim 4, wherein the conductive material comprises one of copper (Cu), aluminum (Al), tungsten (W), nickel (Ni) and cobalt (Co).

6. The method of claim 1, wherein applying the DC power to the target comprises applying about 500 W to about 80 kW of DC power to the target.

7. The method of claim 1, wherein the process gas comprises one of argon (Ar), helium (He), nitrogen (N), hydrogen (H) and oxygen ($O_2$).

8. The method of claim 1, wherein the process gas is supplied to the process chamber at a flow rate of up to about 500 sccm.

9. The method of claim 1, wherein the barrier layer is deposited via a physical vapor deposition process.

10. The method of claim 1, wherein the one or more features comprise an aspect ratio of about 1:1 to about 10:1.

11. The method of claim 1, wherein depositing the barrier layer comprises depositing the barrier layer to a thickness of about 5 to about 1000 Å.

12. The method of claim 1, wherein sputtering a material further comprises:
   rotating a magnetron disposed proximate the target to form a magnetic field proximate the target to increase a density of the plasma proximate a surface of the target.

13. The method of claim 1, further comprising:
   maintaining the process chamber at a temperature of about −40 degrees Celsius to about 600 degrees Celsius while sputtering the material and providing the substrate bias RF power to deposit the seed layer.

14. A computer readable medium, having instructions stored thereon which, when executed by a controller, causes a process chamber having a substrate disposed therein to have layers formed thereon by a method, the method comprising:
   depositing a barrier layer comprising titanium within one or more features in the substrate; and
   sputtering a material from a target in the presence of a plasma formed from a process gas by applying a DC power to the target, maintaining a pressure of less than about 500 mTorr within the process chamber, and providing up to about 5000 W of a substrate bias RF power to deposit a seed layer comprising the material atop the barrier layer.

15. The computer readable medium of claim 14, wherein the substrate bias RF power is provided having a frequency of about 1 MHz to about 60 MHz.

16. The method of claim 14, wherein the seed layer comprises one of copper (Cu), aluminum (Al), Tungsten (W), nickel (Ni) and cobalt (Co).

17. The method of claim 14, further comprising:
   depositing a conductive material atop the seed layer to fill the feature.

18. The method of claim 1, wherein applying the DC power to the target comprises applying about 500 W to about 80 kW of DC power to the target.

19. The method of claim 1, wherein the one or more features comprise an aspect ratio of about 1:1 to about 10:1.

20. A method of forming layers on a substrate disposed in a process chamber, comprising:
   depositing a barrier layer comprising titanium within one or more features in the substrate, wherein the features have an aspect ratio of at least about 4:1;
   sputtering a material comprising copper (Cu) from a target in the presence of a plasma formed from a process gas by applying a about 500 W to about 80 kW of DC power to the target and maintaining a pressure of less than about 500 mTorr within the process chamber;
   rotating a magnetron disposed proximate the target to form a magnetic field proximate the target to increase a density of the plasma proximate a surface of the target;

providing up to about 5000 W of a substrate bias RF power having a frequency of about 1 to about 60 MHz to deposit a seed layer comprising the material atop the barrier layer; and depositing a conductive material atop the seed layer to fill the feature.

* * * * *